United States Patent [19]

Sumi

[11] Patent Number: 5,232,544
[45] Date of Patent: Aug. 3, 1993

[54] APPARATUS FOR PRODUCING AN EMULSION LAYER ON A MESH SCREEN OF A SCREEN PRINTING PLATE

[75] Inventor: Nobuyuki Sumi, Gifu, Japan

[73] Assignees: Tokai Shoji Co., Ltd., Tokyo; Tokai Seiki Co., Ltd., Gifu, both of Japan

[21] Appl. No.: 612,528

[22] Filed: Nov. 13, 1990

[30] Foreign Application Priority Data

Nov. 13, 1989 [JP] Japan .................... 1-294640

[51] Int. Cl.$^5$ .................... B05C 1/00
[52] U.S. Cl. .................... 156/510; 101/123; 101/124; 101/128.4
[58] Field of Search .................... 101/123, 124, 128.4; 427/358; 156/234, 236, 237, 510, 244.16

[56] References Cited

U.S. PATENT DOCUMENTS

| | | | |
|---|---|---|---|
| 3,889,629 | 6/1975 | Black | 101/128.4 |
| 4,363,289 | 12/1982 | Gasser | 101/128.4 |
| 4,509,455 | 4/1985 | Shirataki | 101/123 |
| 4,524,688 | 6/1985 | Glantschnig | 101/124 |
| 4,628,814 | 12/1986 | Klemm | 101/123 |
| 4,668,329 | 5/1987 | Shirataki | 156/237 |
| 4,876,957 | 10/1989 | Sakai | 101/128.4 |
| 4,937,097 | 6/1990 | Ichinose et al. | 101/123 |
| 5,027,703 | 7/1991 | Hancy | 101/123 |

Primary Examiner—David A. Simmons
Assistant Examiner—James J. Engel, Jr.
Attorney, Agent, or Firm—Helfgott & Karas

[57] ABSTRACT

A dual-purpose apparatus for selectively applying an emulsion onto a mesh screen of a screen printing plate and attaching an emulsion layer-containing film to the screen, comprises a printing plate support for supporting the screen printing plate, a film feed device for feeding the emulsion layer-containing film, a film guiding-and-cutting mechanism for guiding the emulsion layer-containing film along the mesh screen of the screen printing plate, and a pressing-and-applying mechanism for pressing the emulsion layer-containing film and for applying the emulsion onto the mesh screen. The pressing-and-applying mechanism includes a support for replaceably supporting a pressure roller unit or an emulsion bucket.

1 Claim, 7 Drawing Sheets

APPARATUS FOR PRODUCING AN EMULSION LAYER ON A MESH SCREEN OF A SCREEN PRINTING PLATE

FIELD OF THE INVENTION

This invention relates to an apparatus for manufacturing a screen printing plate, and more particularly to an apparatus for forming an emulsion layer on a mesh screen of the screen printing plate by selectively applying an liquid emulsion or attaching an emulsion film containing an emulsion layer thereon to the mesh screen. The emulsion layer forming apparatus of this invention includes a replaceable mechanism which can be selectively used for two different functions in one of which the liquid emulsion is directly applied onto the mesh screen of the screen printing plate and in the other of which the emulsion layer in the form of film is attached to the mesh screen.

BACKGROUND OF THE INVENTION

In conventional apparatus used for manufacture of screen printing plates, a photosensitive emulsion layer of a given thickness has been formed onto the mesh screen of the screen printing plate.

It is known that an apparatus includes a bucket in which an emulsion is reserved and which is movable in the upward and downward direction along the mesh screen while it is maintained in an inclined state so that the emulsion is directly applied onto the mesh screen An apparatus for automatically performing such an operation of the bucket is disclosed in Japanese laid-open patent publications Nos. 60-48044 and 60-188948 filed by the present applicant.

In addition, Japanese laid-open patent publications Nos. 60-188949 and 61-113063 filed by the same applicant have disclosed apparatus for forming an emulsion layer onto a mesh screen of a screen printing plate by utilizing the emulsion film which has an emulsion layer of a given thickness and is attached to the mesh screen of the screen printing plate in order to produce the emulsion layer of the given thickness thereon. Further, Japanese laid-open utility model publication No. 1-81654 has also disclosed an emulsion layer forming apparatus in which the emulsion film is attached to the mesh screen. These conventional apparatus include the bucket which is movable while being kept in contact with the mesh screen so that the emulsion layer of the emulsion film is wetted by a liquid emulsion flown out of the bucket disposed on a rear side of the mesh screen and passed therethrough to a front side of the mesh screen. In these apparatus, the emulsion layer of an extremely exact thickness is appropriately formed on the screen printing plate since the emulsion film having an emulsion layer of a given thickness is used.

However, despite of many common components, the apparatus used for applying liquid emulsion has hitherto been manufactured separately from those used for attaching an emulsion layer-containing film. Namely, there has not existed the single apparatus which is capable of being utilized both for applying liquid emulsion and for attaching the emulsion layer-containing film on the mesh screen of the screen printing plate.

Therefore, it has been required to individually install both devices in order to apply directly the emulsion and attach the emulsion film. In this case, there are deficiencies that a sufficient area for installing the apparatus is necessary and costs of installation thereof are increased.

SUMMARY OF THE INVENTION

Accordingly, the present invention is directed to elimination of the aforementioned disadvantages existing in the conventional single purpose apparatus which is only used either for a direct application of a liquid emulsion or attachment of the emulsion film.

It is an object of the invention to provide a dual-purpose apparatus for selectively applying the liquid emulsion or attaching the emulsion film on the screen printing plate, whereby the installation area and costs are considerably saved. Namely, the apparatus has a pressing roller for applying the emulsion film onto the mesh screen, which roller is replaceable with an emulsion bucket for reserving the emulsion to be applied onto the mesh screen. Another emulsion bucket is disposed on an opposite (rear) side of the mesh screen while the pressing roller and the first emulsion bucket are replaceably disposed on a printing (front) side of the mesh screen of the screen printing plate. To this end, the mesh screen is interposed between them. Further, an emulsion layer is formed on the printing side of the mesh screen when the pressing roller or the emulsion bucket on the printing side of the mesh screen press the mesh screen in cooperation with the emulsion bucket on the rear side thereof.

In order to achieve the object mentioned above, the apparatus according to the invention includes a supporting frame, a printing plate supporting means for supporting a screen printing plate, a film feed means for feeding an emulsion film, a film guiding- and cutting-mechanism for guiding the emulsion film along the mesh screen of the screen printing plate and cutting the film into a predetermined length while holding the film, and a pressing- and applying-mechanism for selectively applying an emulsion and the emulsion film onto the mesh screen.

The pressing- and applying-mechanism includes a pressing/applying selecting means and an emulsion applying means, which are respectively disposed on front and rear sides of the screen printing plate. The pressing/applying selecting means is replaceably equipped with a roller unit for pressing and applying the emulsion film onto the mesh screen of the screen printing plate, and a bucket unit for applying the emulsion onto the mesh screen or squeezing the emulsion therefrom. The emulsion applying means contains an emulsion bucket 97 for applying the emulsion onto the mesh screen or squeezing the emulsion therefrom.

The pressing/applying selecting means and the emulsion applying means respectively include a front bucket pipe and a rear bucket pipe. Both of the bucket pipes are disposed between carriage bases of the pressing- and applying-mechanism which are vertically movable along right and left side walls of the supporting frame. The respective bucket pipes are permitted to advance toward and retreat from the screen printing plate and incline thereto. These selecting and applying means and separately have actuating systems for moving the respective bucket pipes which are almost symmetrically arranged on the front and rear sides of the screen printing plate. The roller unit and the bucket unit which are replaceable with each other are selectively mounted on the front bucket pipe of the pressing/applying selecting means. The emulsion bucket is mounted on the rear bucket pipe of the emulsion applying means.

The roller unit includes a roller unit base which is mounted on the front bucket pipe by clamps, right and left roller guide blocks which are level-adjustably disposed on the roller unit base, and a pressing roller which is rotatably supported on the right and left roller guide blocks.

The dual-purpose apparatus for applying the emulsion and the emulsion film according to the invention, has pressing/applying selecting means of the pressing- and applying-mechanism of a specific structure. The pressing/applying selecting means is equipped with the roller unit upon applying the emulsion film onto the mesh screen or with the bucket unit upon applying the emulsion onto the mesh screen, and synchronously actuated together with the emulsion applying means equipped with the emulsion bucket.

In the case of applying the emulsion film onto the mesh screen, the film feed means feeds the emulsion film to the mesh screen of the screen printing plate supported by the printing plate supporting means. Subsequently, the emulsion film drawn out from the film feed means is cut into a predetermined length by the film guiding- and cutting-mechanism and held in contact with the mesh screen.

Further, in the pressing/applying selecting means of the pressing- and applying-mechanism on standby in a lower portion of the screen printing plate, the pressing roller disposed on the front side of the mesh screen presses the emulsion film such that the film on the mesh screen is interposed between the roller and the emulsion bucket disposed the rear side of the mesh screen Then, level of the pressing roller is adjusted so as to be positioned opposite to a front edge of the emulsion bucket.

The emulsion bucket is inclined with respect to the mesh screen by pivotally turning the rear bucket pipe. When the carriage bases move upward, the emulsion bucket presses the mesh screen while the emulsion is flown from the inclined emulsion bucket downward along the mesh screen. Then, the emulsion flown from the emulsion bucket passes through the emulsion film into the emulsion layer of the film which is pressed by the pressing roller onto the mesh screen. To this end, the emulsion film is attached onto the mesh screen because the emulsion layer of the film is wetted by the emulsion.

In the case of directly applying the emulsion onto the mesh screen, the bucket unit is mounted on the front bucket pipe of the pressing/applying selecting means of the pressing- and applying-mechanism.

When the front bucket pipe of the pressing/applying selecting means and the rear bucket pipe of the emulsion applying means respectively advance toward the mesh screen, the emulsion buckets mounted on the front and rear bucket pipes advance toward the mesh screen so that the mesh screen is interposed between the emulsion buckets. Further, when the emulsion buckets are inclined with respect to the mesh screen, the emulsion in the respective buckets is flown out thereof.

In this case, each of the emulsion buckets is separately and independently controlled for its advancing and inclining movements. If each of the emulsion buckets presses the mesh screen while maintained in non-inclined state, then the emulsion is squeezed from the mesh screen. On the other hand, when each of the buckets presses the mesh screen while kept in inclined state, the emulsion is applied onto the mesh screen.

BRIEF DESCRIPTION OF THE DRAWINGS

The present invention will be more clearly understood from the following detailed description of the preferred embodiment of the invention with reference to the accompanying drawings, in which.

PREFERRED EMBODIMENTS OF THE INVENTION

Outline

In the drawings, a reference numeral 1 represents a supporting frame which is of a rectangular shape as seen from its front side and provided with a printing plate supporting means 10 for retaining a screen printing plate S.

A film feed means 20 for feeding an emulsion film F which is applied onto the screen printing plate S is positioned at an upper portion of the supporting frame 1. The emulsion film F fed by a film feed means 20 is led onto the screen printing plate S and cut into a predetermined length by a film guiding- and cutting-mechanism 30 which is positioned at the upper portion of the supporting frame 1 and below the film feed means 20. The emulsion film F is applied onto a mesh screen of the screen printing plate S by a pressing- and applying-mechanism 60 equipped with a pressing roller 87.

On the other hand, when the pressing- and applying-mechanism 60, in which an emulsion bucket 92 is substituted for the pressing roller 87, is used, an emulsion E can be applied onto the mesh screen of the screen printing plate S such that an emulsion layer of a predetermined thickness is formed on the mesh screen.

Emulsion Film

The emulsion film F is prepared in such a way that a wettable photosensitive emulsion is applied onto a sheet-like substrate of synthetic resin to form an emulsion layer thereon. Alternatively, a resinous emulsion film having a predetermined thickness may be laminated on the substrate. In this case, the predetermined thickness of the film overlaid is equivalent to that of the emulsion layer applied onto the mesh screen of the screen printing plate S.

Printing Plate Supporting Means

The printing plate supporting means 10 includes upper and lower plate clamp bars 11 which are respectively supported on top and bottom portions of the supporting frame 1 and extended between right and left side walls thereof, and a pair of supporting clamps 12 which are mounted on the respective plate clamp bars 11.

Figure 1:
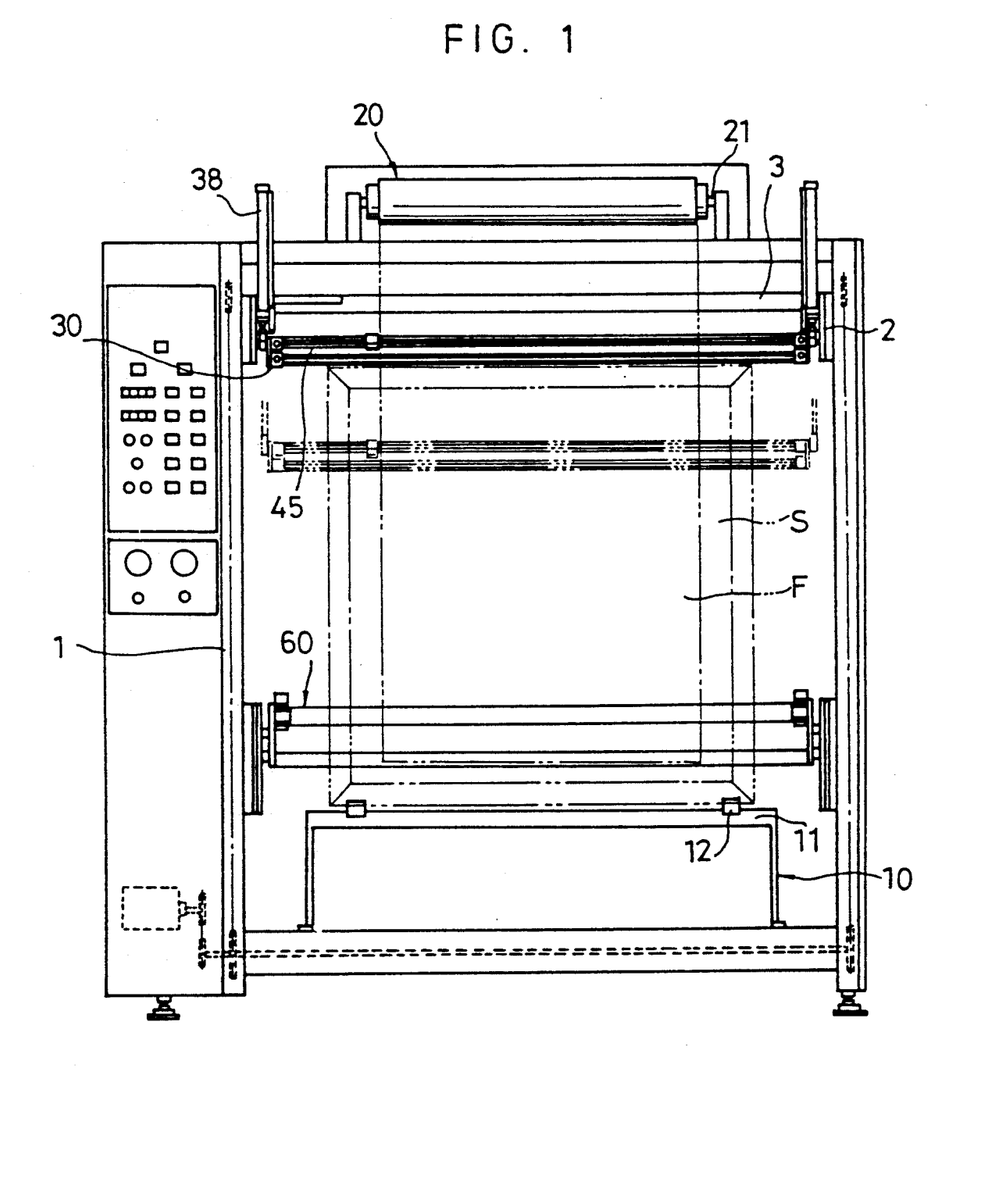
FIG. 1 is a front view of the entire apparatus according to the invention.
Figure 2:
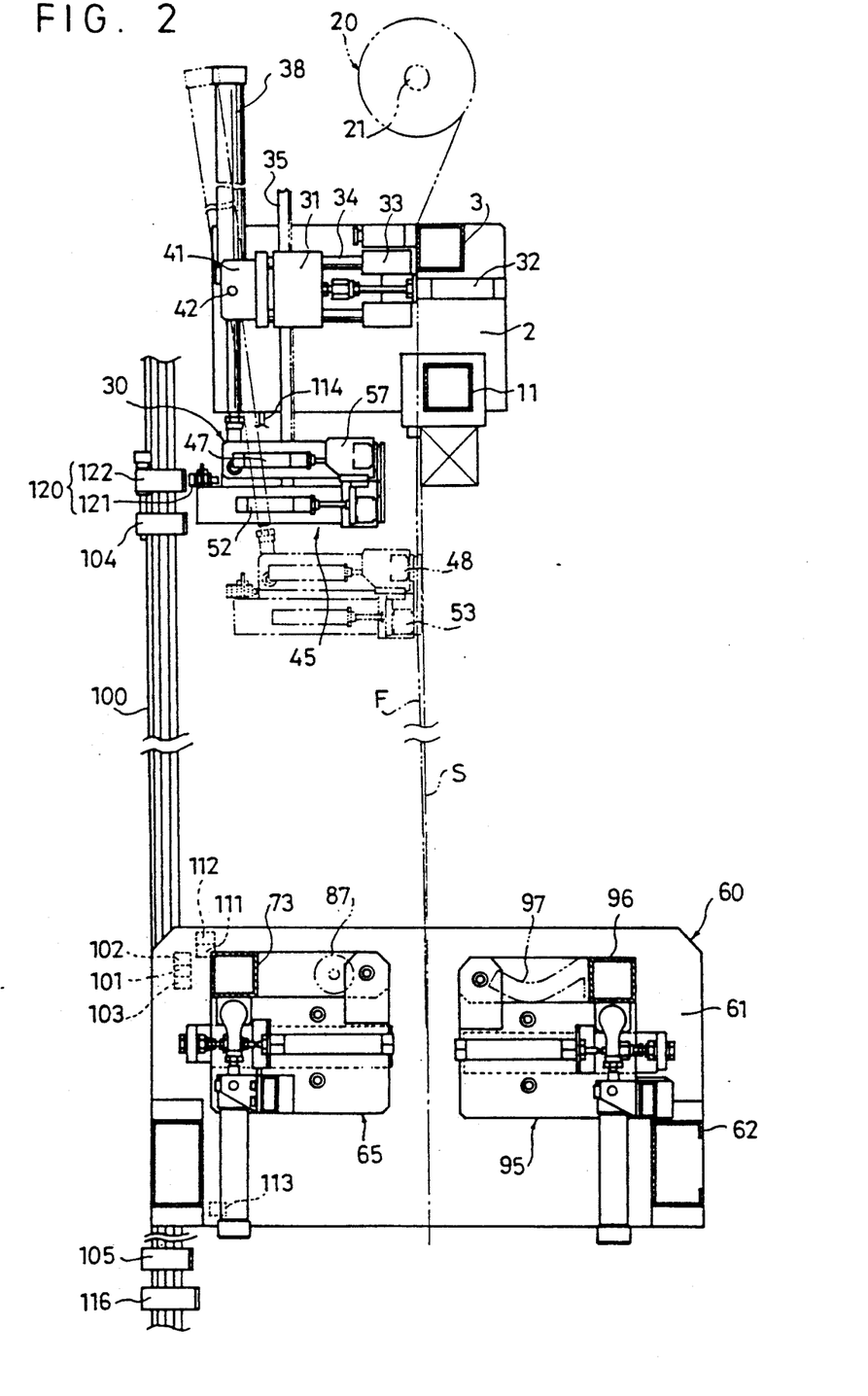
FIG. 2 is a longitudinal sectional side view of the apparatus according to the invention.

Referring to FIG. 1, the screen printing plate S is retained in a substantially vertical state in the supporting frame 1 by two pairs of the supporting clamps 12 which are respectively mounted at right and left ends of the upper and lower plate clamp bars 11. As shown in FIG. 2, the emulsion film F is applied onto a printing side of the mesh screen of the screen printing plate S, which is positioned on a front side of the supporting frame 1.

The upper plate clamp bar 11 is extended between clamp bar side plates 2 which are oppositely arranged on the right and left side walls of the supporting frame 1 so as to be vertically movable along the side walls. To this end, the upper plate clamp bar 11 is movable in the vertical direction so as to allow height-adjustment thereof according to a size of the screen printing plate S. The opposite clamp bar side plates 2 are unitedly connected to each other through a counter shaft pipe 3 fixed on inside faces thereof and are moved in the vertical direction by guide means 4 arranged on inside faces of the right and left side walls of the supporting frame 1 (see FIG. 4).

Film Feed Means

The film feed means 20 which includes a supporting roll 21 rotatably supported at the upper portion of the supporting frame 1, holds and feeds the emulsion film F.

The emulsion film F of the predetermined thickness is rolled up and held on the supporting roll 21. When the rolled emulsion film F is unrolled and fed, an emulsion-applied side of the emulsion film F faces the printing side of the mesh screen of the screen printing plate S.

Film Guiding- and Cutting-Mechanism

Referring to FIGS. 2 to 5, the film guiding- and cutting-mechanism 30 includes gear housings 31 which are arranged on right and left sides of the supporting frame 1 and connected to a film cutting- and supporting-means 45. The film cutting- and supporting-means 45 is allowed to horizontally advance toward and retreat from the screen printing plate S by a horizontally actuating mechanism 32 and to move in the vertical direction by a vertically actuating mechanism 38. The emulsion film F unrolled from the film feed means is held and guided downward by means of the film cutting- and supporting-means 45 while abutting against the mesh screen of the screen printing plate S. Then the emulsion film F drawn downward is cut into a predetermined length by the film cutting- and supporting-means 45. After such a cutting operation, the film cutting-and supporting-means 45 keeps holding a lower end of the emulsion film F which is drawn from the film feed means 20 and the upper end of the emulsion film F which is cut into the predetermined length and extended over the screen printing plate.

The film guiding- and cutting-mechanism 30 is disposed between the clamp bar side plates 2 placed on the right and left side walls of the supporting frame 1.

Horizontally Actuating System of Film Guiding- and Cutting-Mechanism

Figure 3:
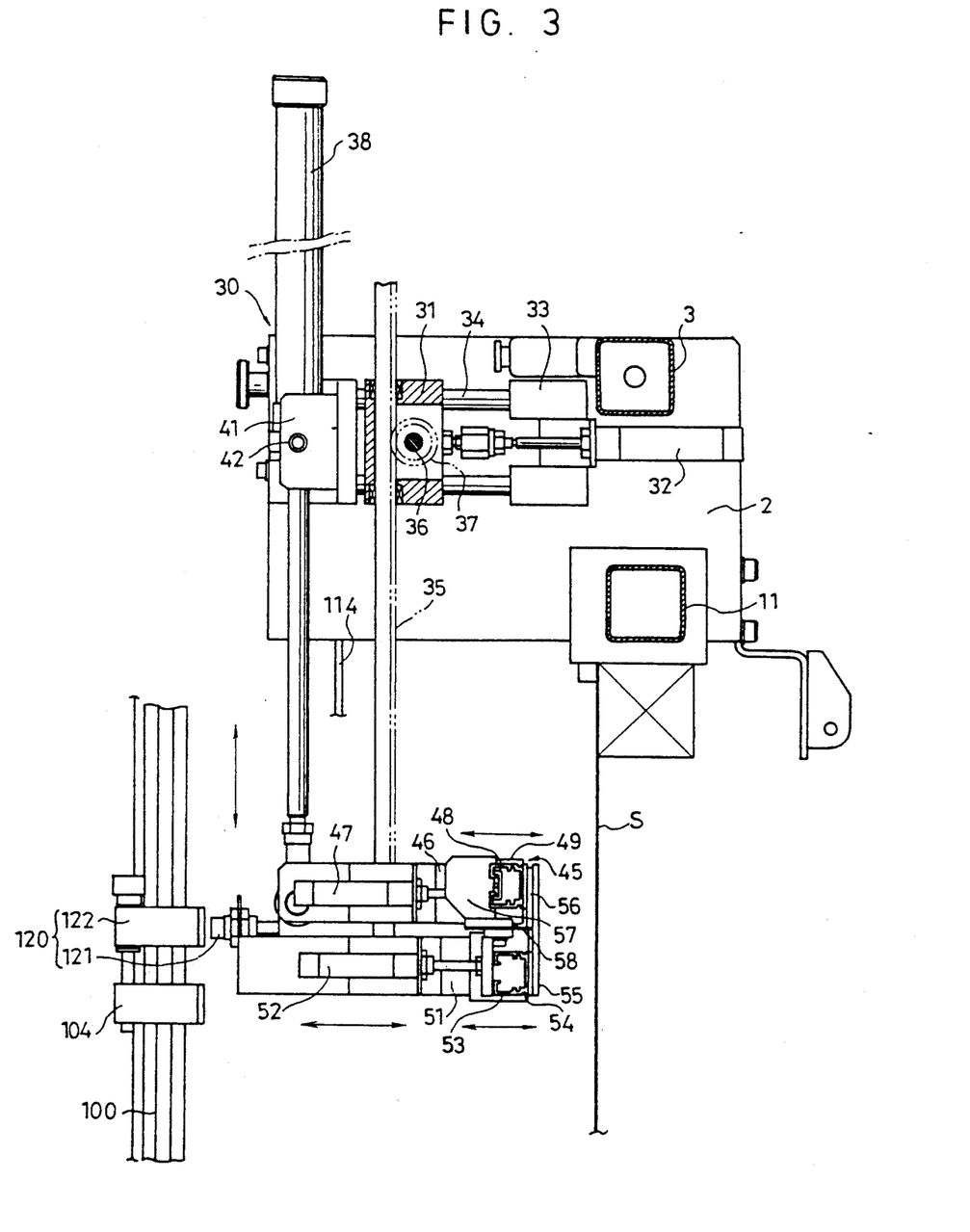
FIG. 3 is a sectional view of an essential part of the film guiding- and cutting-mechanism.

Referring to FIGS. 2 and 3, the horizontally actuating system of the film guiding- and cutting-mechanism 30 includes horizontally actuating cylinders 32 disposed between the respective inside faces of the clamp bar side plates 2 arranged on the right and left sides of the supporting frame 1. The film cutting- and supporting means 45 is also supported through timing racks 35 by right and left gear housings 31. The cylinders 32 permits the gear housings 31 to horizontally advance toward and retreat from the screen printing plate S.

As shown in FIGS. 2 and 3, the respective gear housings 31 are connected to slide shafts 34 slidably passing through slide shaft blocks 33 fixed between the inside faces of the right and left clamp bar side plates 2. Further, the respective gear housings 31 are connected through floating joints to the respective ends of cylinder rods of the horizontally actuating cylinders 32 fixed on the inside faces of the right and left clamp bar side plates 2.

Vertically Actuating System of Film Guiding- and Cutting-Mechanism

Figure 4:
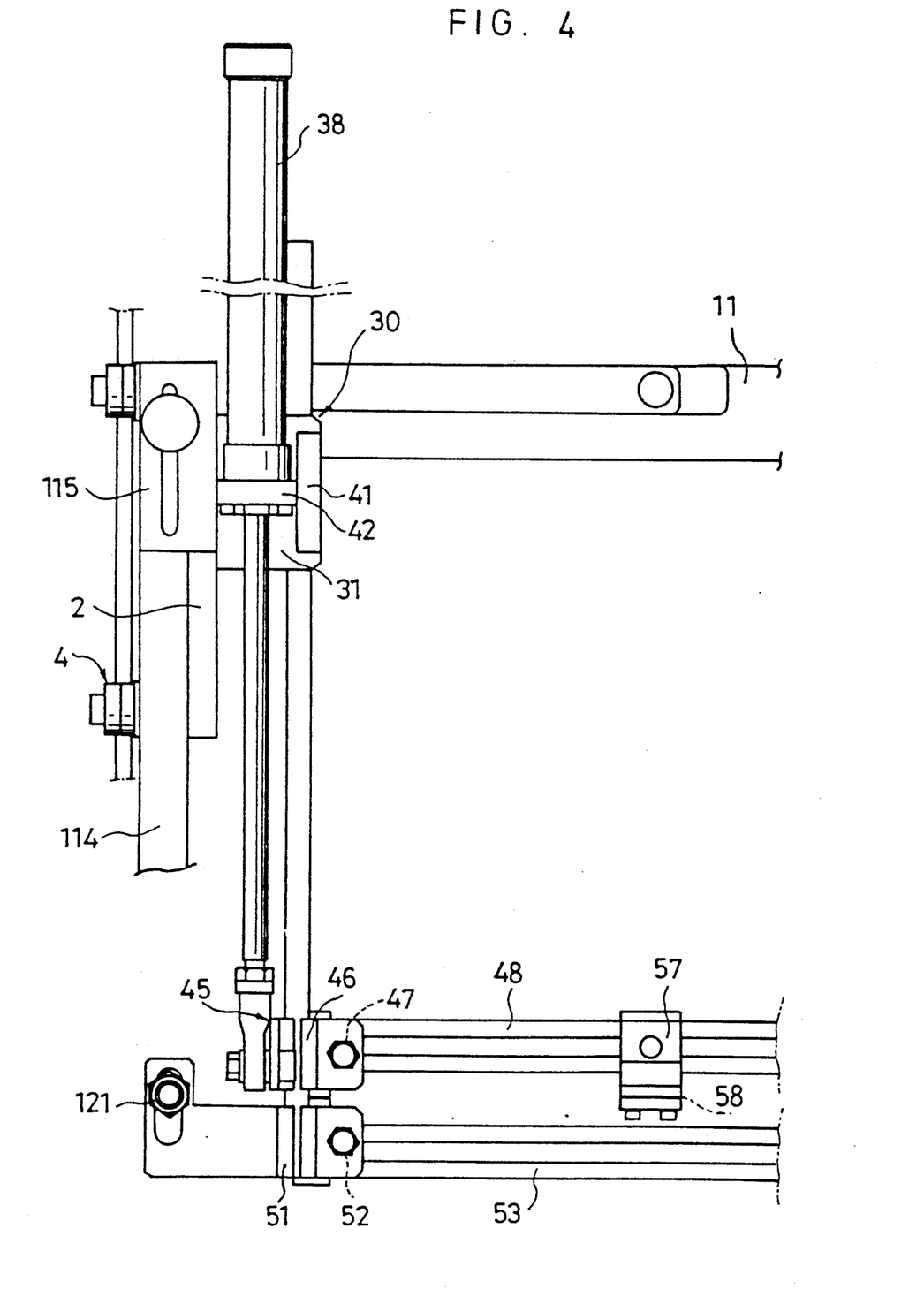
FIG. 4 is a front view of an essential part of the film guiding- and cutting-mechanism.

Referring to FIGS. 2 to 4, the vertically actuating system serves for the vertical reciprocating movement of the film cutting- and supporting means 45. Namely, the timing racks 35 are respectively arranged inside the right and left clamp bar side plates 2 and extend through the gear housings 31 in the vertical direction. At the lower ends of the timing racks 35 is fixed the film cutting- and supporting means 45. Pinions 37 are fixed on a counter shaft 36 journaled between the right and left gear housings 31 and are engaged with the timing racks 35. A pair of vertically actuating cylinders 38 are pivotably mounted on the inside faces of the clamp bar side plates 2. To this end, when cylinder rods of the vertically actuating cylinders 38 stretch or contact in the vertical direction, the respective timing racks 35 are allowed to move upward and downward in synchronized relation to the vertical movement of the cylinders 38.

As described hereinbefore, when the cylinder rods of the vertically actuating cylinders 38 longitudinally extend and contract resulting from a vertical movement of the cylinders 38, the timing racks 35 engaged with the right and left pinions 37 on the counter shaft 36 move vertically. Therefore, the film cutting- and supporting means 45 smoothly moves up and down while keeping balance on its right and left sides.

The respective vertically actuating cylinders 38 are disposed in an upright state on a front side of the gear housings 31 and supported oscillatingly around supporting pins 42 which extend through supporting blocks 41 fixed on the inside faces of the clamp bar side plates 2. The film cutting- and supporting means 45 is connected through uniball joints to end portions of the cylinder rods of the vertically actuating cylinders 38. When the film cutting- and supporting means 45 moves down and then horizontally advances toward the printing side of the mesh screen of the screen printing plate S, the vertically actuating cylinders 38 smoothly oscillate relative to the supporting pins 42 to follow the advancing movement of the film cutting- and supporting means 45.

Film Cutting- and Supporting-Means of Film Guiding- and Cutting-Mechanism

Referring to FIGS. 2 to 5, the film cutting- and supporting means 45 includes upper rail supporting bars 46 and lower rail supporting bars 51, which are respectively secured in the substantially horizontal direction on the lower end portions of the right and left timing racks 35. Each rear end face of the rail supporting bars 46, 51 is opposed to the mesh screen of the screen printing plate S. A cutting guide-on plate 55 is extended in the horizontal and vertical directions and mounted to cover all rear end faces of the supporting bars 46, 51.

Upper clamp cylinders 47 secured on the upper rail supporting bars 46 permits an upper clamp rail 48 extending in parallel with a cutter guide plate 56 fixed on the cutter guide-on plate 55 to advance toward and retreat from the cutter guide plate 56. In the retreating position of the upper clamp rail 48, the emulsion film F drawn down from the film feed means 20 is able to pass through a gap existing between the cutter guide plate 56 and the upper clamp rail 48.

Lower clamp cylinders 52 secured on the lower rail supporting bars 51 permits a lower clamp rail 53 extending in parallel with the cutter guide-on plate 55 to advance toward and retreat from the cutter guide-on plate 55. In the retreating position of the lower clamp rail 53, the emulsion film F drawn down is able to further pass through a gap formed between the cutter guide-on plate 55 and the lower clamp rail 53.

Moreover, a cutter holder 57 for holding a cutter 58 is mounted on the upper clamp rail 48 and horizontally movable along the upper clamp rail 48.

The end portions of the cylinder rods of the vertically actuating cylinders 38 are connected to either the upper rail supporting bars 46 or the lower rail supporting bars 51 of the film cutting- and supporting-means 45. The vertically actuating cylinders 38 are actuated such that the timing racks 35 permit the film cutting- and supporting-means 45 to freely move upward and downward in the vertical direction.

The upper clamp rail 48 is mounted between upper rail side blocks 49 which are slidably moved on the upper rail supporting bars 46 fixed on the right and left timing racks 35. The rod ends of the upper clamp cylinders 47 are secured on the upper rail side blocks 49 so that the upper clamp rail 48 is allowed to advance toward and retreat from the printing side of the mesh screen of the screen printing plate S when the upper rail side blocks 49 are slidably moved on the upper rail supporting bars 46.

In the same manner as the upper clamp rail 48, the lower clamp rail 53 is mounted between lower rail side blocks 54 which are slidably moved on the lower rail supporting bars 51 fixed on the right and left timing racks 35. The rod ends of the lower clamp cylinders 52 are secured on the lower rail side blocks 54 so that the lower clamp rail 53 is also allowed to advance toward and retreat from the printing side of the mesh screen of the screen printing plate S when the lower rail side blocks 54 are moved slidably on the lower supporting bars 51.

Figure 5:
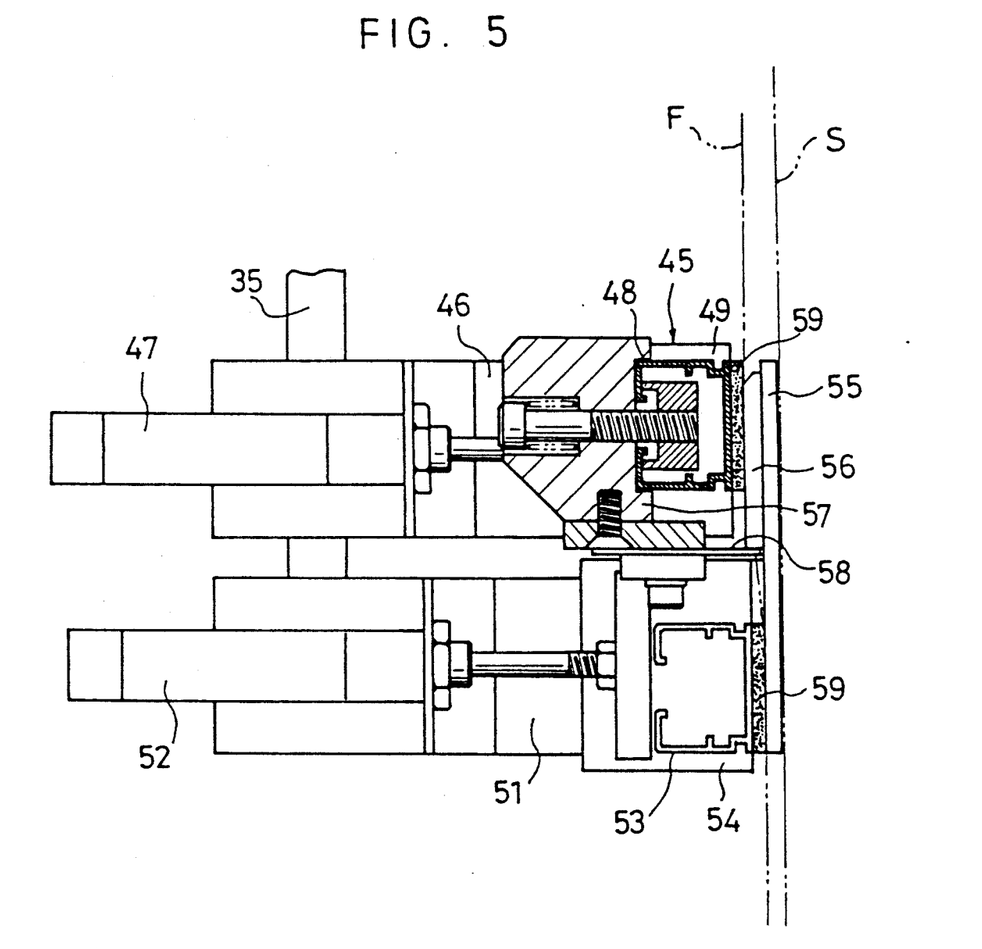
FIG. 5 is a longitudinal sectional side view of an essential part of the film cutting- and supporting-means showing the emulsion film held therein.

As shown in FIGS. 3 and 5, the cutter 58 is detachably mounted on a cutter clamp plate fixed on the cutter holder 57 which is mounted elastically on a lip-channel portion of the upper clamp rail 48 so as to slide along the upper clamp rail 48. One end of the cutter 58 is fixed to contact the lower end of the cutter guide plate 56.

The cutter holder 57 is movable by a manual operation or any mechanical operation which is not shown in the drawings The numerals 59, 59 represent protectors made of such a material as rubber for protecting the emulsion film F, which are respectively attached onto the upper clamp rail 48 and the lower clamp rail 53. The emulsion film F is interposed between the protector 59 attached onto the upper clamp rail 48 and the cutter guide plate 56 and between the protector 59 attached onto the lower clamp rail 53 and the cutter guide-on plate 55.

Film-Cutting-Position Detecting Means of Film Guiding- and Cutting-Mechanism Cutting of the emulsion film by the film cutting- and supporting means 45 is performed at the upper portion of the emulsion film F to be attached over the screen printing plate S. The film guiding- and cutting-mechanism 30 is controlled by a film-cutting-position detecting means 120 so as to be vertically moved downward to a predetermined position.

As shown in FIGS. 2 and 3, the film-cutting-position detecting means 120 includes a proximity sensor 121 mounted on the film cutting- and supporting-means 45, and a sensor block 122 which can be vertically adjusted so as to move to the predetermined position where the film should be cut.

The proximity sensor 121 is secured at the end portion of the lower clamp rail 53 of the film cutting- and supporting-means 45. The sensor block 122 is slidably mounted on a sensor rail 100 which is fixed, and extended in the vertical direction, on the inside face of either one of the right and left side walls of the supporting frame 1.

In the film guiding- and cutting-mechanism 30 thus constituted, the vertically actuating system (38) allows the film cutting- and supporting means 45 to move downward and the proximity sensor 121 moves downward so as to approach the sensor block 122. When the proximity sensor 121 detects the sensor block 122, the vertically actuating system (38) stops its vertical downward movement and the film cutting- and supporting-means 45 stops at the predetermined position where the film should be cut.

Pressing- and Applying-Mechanism

Figure 6:
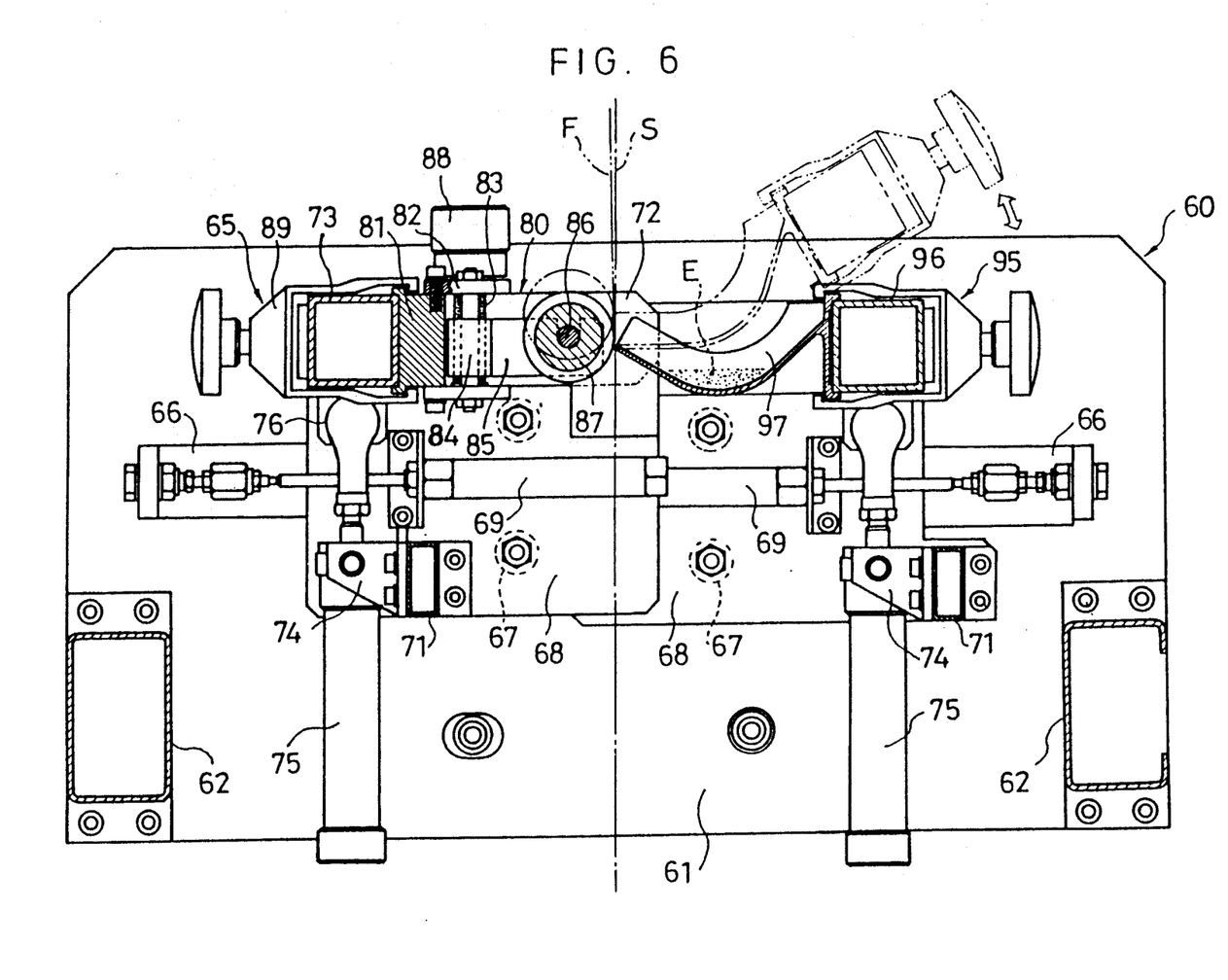
FIG. 6 is a side view of the pressing- and applying-mechanism upon applying the emulsion film onto the mesh screen.
Figure 7:
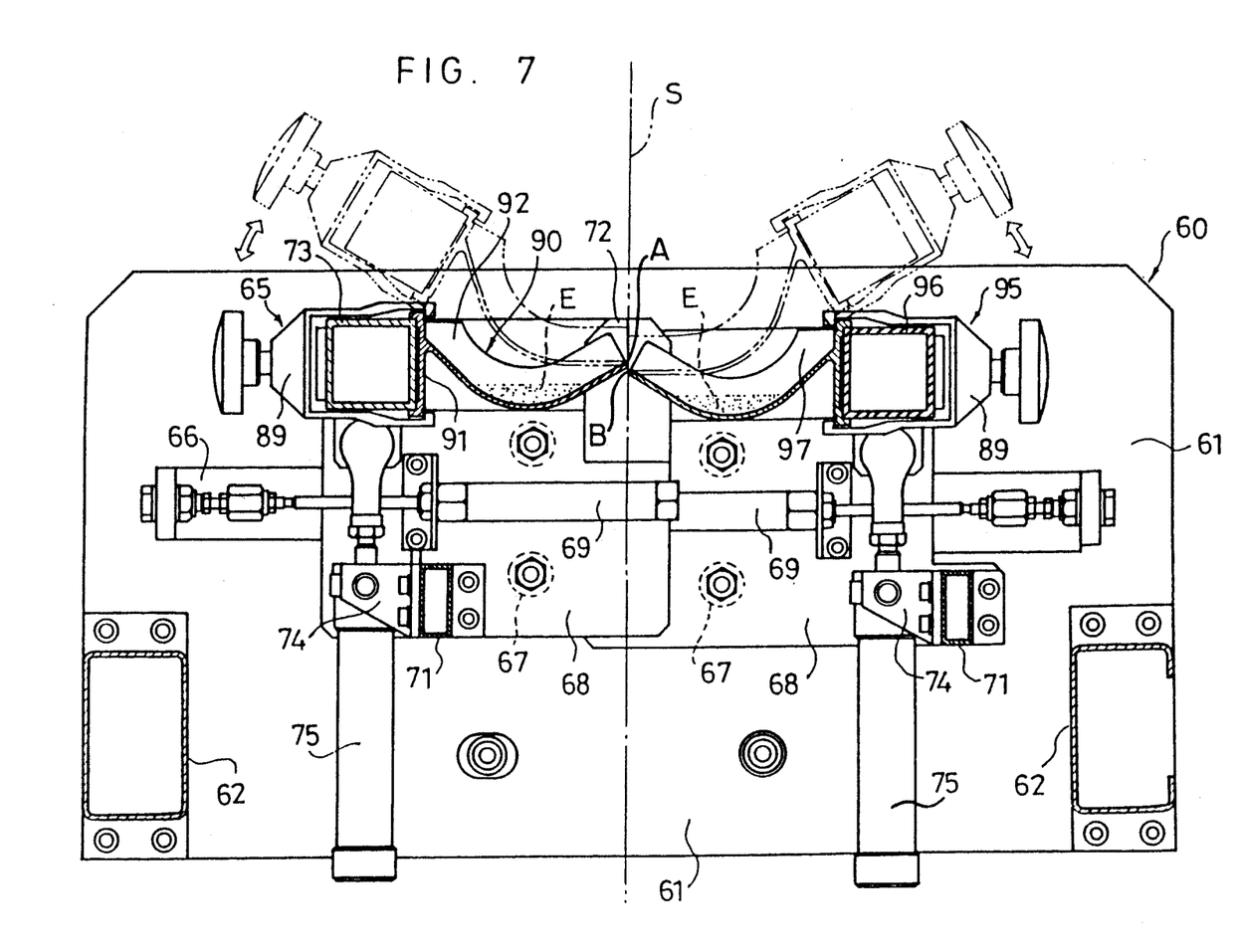
FIG. 7 is a side view of the pressing- and applying-mechanism upon applying the emulsion onto the mesh screen.

Referring to FIGS. 2, 6 and 7, the pressing- and applying-mechanism 60 includes a pressing/applying selecting means 65 and an emulsion applying means 95, which are respectively positioned on the front and rear sides of the screen printing plate S and movable up- and down-ward along the right and left side walls of the supporting frame 1.

The pressing/applying selecting means 65 serves for pressing the emulsion film F to be attached onto the mesh screen of the screen printing plate S or for supplying the emulsion E to be applied onto the mesh screen and squeezing the emulsion E applied thereon. Either a roller unit 80 for pressing the emulsion film F onto the mesh screen or a bucket unit 90 for supplying and squeezing the emulsion E is replaceably mounted on the pressing/applying selecting means 65.

On the other hand, the emulsion applying means 95 serves for supplying the emulsion E to be applied onto the mesh screen and squeezing the emulsion E applied thereon. The emulsion applying means 95 is provided with an emulsion bucket 97 for performing such emulsion applying and squeezing operations.

Carriage bases 61 are disposed adjacent and in parallel with the respective inner faces of the right and left side walls of the supporting frame 1. The carriage bases 61 are moved upward and downward by a looped chain drive mechanism along the right and left side walls of the supporting frame 1. On each carriage base 61, the pressing/applying selecting means 65 is provided on its front side with respect to the screen printing plate S, namely on the side thereof onto which the emulsion film F is attached, while the emulsion applying means 95 is provided on its rear side with respect to the screen printing plate S.

As shown in FIGS. 6 and 7, the right and left carriage bases 61 are connected to each other through carriage pipes 62 fixed at their front and rear ends, so that the carriage bases 61 are movable upward and downward as one united body.

Pressing/Applying Selecting Means of Pressing- and Applying-Mechanism

Referring to FIGS. 6 and 7, the pressing/applying selecting means 65 includes a slide rail 66 which is fixedly mounted on the front side of each of the carriage bases 61 in the substantially horizontal direction. The slide rail 66 is sandwiched between upper and lower slide rollers 67 which are rollably seated thereon and axes of which are fixed on right and left slide plates 68 so that the slide plates 68 are slidably disposed on the right and left carriage bases 61. A horizontally actuating cylinder 69 is fixedly mounted on each of the slide plates 68. An end of a cylinder rod of the horizontally actuating cylinder 69 is connected to an end portion of the slide rail 66. The right and left slide plates 68 are connected to each other through a slide plate pipe 71 so as to be movable as an unit in the fore and aft direction, namely toward and apart from the printing side of the mesh screen of the screen printing plate S. A pair of bucket pipe arms 72 are respectively supported on inner faces of the right and left slide plates 68. The right and left bucket pipe arms 72 are connected to each other through a front bucket pipe 73. The front bucket pipe 73 is connected through joint arms 76 to ends of cylinder rods of inclining cylinders 75 supported by cylinder trunnion plates 74 which are respectively fixed on right and left side faces of the slide plate pipe 71.

Further, on the front bucket pipe 73 are replaceably mounted either a roller unit 80 for pressing the emulsion film F onto the screen printing plate S or a bucket unit 90 for supplying or squeezing the emulsion E.

As shown in FIGS. 2 and 6, the roller unit 80 includes a roller unit base 81 which is attached to a rear side face of the front bucket pipe 73. Two pairs of upper and lower roller guide plates 82 are respectively fixed on right and left end portions of the roller unit base 81. Roller adjusting bolts 83 are inserted through the upper and lower roller guide plates 82 so that right and left adjusting blocks 84 mounted on the roller adjusting bolts are adjustable in their vertical position. Roller guide blocks 85 are respectively secured on the right and left adjusting blocks 84. A pressing roller 87 which has a rubber lining on its peripheral surface to protect the emulsion film F, is rotatably supported between the right and left roller guide blocks 85 by a roller shaft 86.

The roller unit 80 per se fixedly abuts against the rear side face of the front bucket pipe 73 by right and left clamps 89 extending from a front side of the front bucket pipe 73 to a rear side thereof.

Adjusting knobs 88 for the right and left roller adjusting bolts 83 are rotatably operable to move upward and downward the respective roller guide blocks 85 through the adjusting blocks 84. To this end, the right and left roller guide blocks 85 are separately fine-adjustable in height.

The pressing roller 87 presses the emulsion film F against the mesh screen of the screen printing plate S, in cooperation with an emulsion bucket 97 disposed on the rear side of the mesh screen. Since the pressing roller 87 is rotatable, a friction-resistance exerted on the emulsion film F is lowered to prevent the emulsion film F from any damages thereby. Other pressing members having a bucket structure similar to the emulsion bucket 92 (97) or a blade structure may be substituted for the pressing roller 87.

On the other hand, the bucket unit 90 shown in FIG. 7 includes a bucket base 91 which abuts against the rear side of a front bucket pipe 73. An emulsion bucket 92 which has an approximately arcuate cross section is attached on the bucket base 91 so as to form one united body. While the emulsion bucket 92 is vertically moved, its distal end is allowed to contact the mesh screen of the screen printing plate S.

The bucket unit 90 per se is, in the same manner as the roller unit 80, fixed to the rear side face of the front bucket pipe 73 by right and left clamps 89 grasping the front bucket pipe 73 from the front side to the rear side thereof.

The roller unit 80 and the bucket unit 90 are replaceably mounted on the front bucket pipe 73 by means of the clamps 89 depending upon applying either the emulsion film F or the emulsion E onto the mesh screen.

Emulsion Applying Means of Pressing- and Applying-Mechanism

The emulsion applying means 95 is disposed on the rear side of the carriage base 61 in a substantially symmetric position with respect to the pressing/applying selecting means 65 and has a structure similar to that of the pressing/applying selecting means 65. The different point in the structure between the emulsion applying means 95 and the pressing/applying selecting means 65 is that only an emulsion bucket 97 is mounted on a rear bucket pipe 96 without replacing it with as a roller unit as described in the case of the pressing/applying selecting means resin above. Like references refer to like parts without a detailed explanation for the respective parts in FIG. 7.

Function of Emulsion Bucket

Referring to FIGS. 6 and 7, the emulsion buckets 92, 97 are moved toward and apart from the mesh screen of the screen printing plate S by the horizontally actuating cylinders 69. Further, the emulsion buckets 92, 97 are moved upward and downward while their front edges are kept in contact with the mesh screen in association with up- and down-movements of the carriage bases 61. When the emulsion buckets 92, 97 are inclined to the mesh screen by actuation of inclining cylinders 75, the emulsion E in the buckets 92, 97 flows out at their front edges and is applied onto the both, front and rear sides of the mesh screen.

In FIG. 6, the emulsion bucket 97 of the emulsion applying means 95 is inclined so that the emulsion E is applied onto the mesh screen, while the pressing roller 87 of the pressing/applying selecting means 65 presses the emulsion film F. In such a condition, when the carriage bases 61 move upward, the emulsion E applied onto the mesh screen is passed therethrough and wets the emulsion film F to be attached onto the mesh screen.

In FIG. 7, the emulsion bucket 97 of the emulsion applying means 95 is inclined so that the emulsion E is applied onto the mesh screen, while the emulsion bucket 92 of the pressing/applying selecting means 65 presses the mesh screen without being inclined. In such a condition, when the carriage bases 61 move upward, the emulsion E is applied onto the mesh screen from the emulsion bucket 97 and squeezed therefrom by the emulsion bucket 92. Inversely, the emulsion bucket 97 of the emulsion applying means 95 presses the mesh screen without being inclined, while the emulsion bucket 92 of the pressing/applying selecting means 65 is inclined and supplies the emulsion E onto the mesh screen. In such a condition, the emulsion E is applied onto the mesh screen by the emulsion bucket 92 and squeezed therefrom by the emulsion bucket 97 in association with an upward movement of the carriage bases 61.

Contacting Points on the Mesh Screen

Contacting point A of the mesh screen with the pressing roller 87 or the emulsion bucket 92 is vertically offset from a contacting point B of the mesh screen with the emulsion bucket 97 (FIG. 7) so that the distal end of the emulsion bucket 92 or a horizontal axis of the pressing roller 87 is not aligned with the distal end of the emulsion bucket 97 on the mesh screen (see FIGS. 6 and 7).

The offset of the above contacting points result in preventing a direct collision of the pressing forces respectively exerted on the front and rear sides of the mesh screen by the pressing roller 87 or the emulsion bucket 92 and the emulsion bucket 97. Particularly, when the emulsion buckets 92, 97 press the front and rear sides of the mesh screen, applying and squeezing operations of the emulsion E are considerably facilitated.

Stroke Adjustment Means of the Pressing- and Applying-Mechanism

A stroke adjustment means sets upper and lower limit of the upward- and downward-movement of the pressing- and applying-mechanism 60 upon applying the emulsion film F and the emulsion E onto the mesh screen.

The stroke adjustment means includes a plurality of proximity sensors and sensor plates corresponding thereto. Referring to FIG. 2, in order to set a stroke for applying the emulsion film F onto the mesh screen, an upper limit proximity sensor 101, a medium proximity sensor 102 and a lower limit proximity sensor 103 are mounted on either one of the carriage bases 61 of the pressing- and applying-mechanism 60. The upper limit proximity sensor 101 serves for limiting an upward movement of the mechanism 60 when the mechanism 60 approaches its upper limit position The medium proximity sensor 102 serves for limiting a medium position at which the inclined emulsion bucket 97 is returned to an horizontal rest position thereof while upward-moving speed of the mechanism is reduced before stopping at the upper limit position. The lower limit proximity sensor 103 serves for limiting a downward movement of the mechanism 60 when the mechanism 60 approaches its lower limit position. An upper sensor plate 104 is height-adjustably mounted on the sensor rail 100 so as to alter the upper limit position and the medium position of the mechanism 60. Further, a lower sensor plate 105 is height-adjustably mounted on the sensor rail 100 so as to alter the lower limit position of the mechanism 60.

As described hereinafter, when the pressing- and applying-mechanism 60 moves upward and approaches the film cutting- and supporting means 45, the upper limit proximity sensor 101 detects the existence of the film cutting- and supporting means 45. The detection causes the film cutting- and supporting means 45 to escape upwardly from the pressing- and applying-mechanism 60.

On the other hand, in order to set a stroke for application of the emulsion E onto the mesh screen, there are provided sensors of the same type as ones used for setting the stroke for pressing of the emulsion film F. Namely, as shown in FIG. 2, an upper limit proximity sensor 111, a medium proximity sensor 112 and a lower limit proximity sensor 113 are mounted on the carriage base 61. The upper limit proximity sensor 111 serves for limiting an upward movement of the pressing- and applying-mechanism 60 when the mechanism 60 approaches its upper limit position. The medium proximity sensor 112 detects a medium position for the pressing- and applying-mechanism 60, where the inclined emulsion buckets 92, 97 are returned to their horizontal rest position. Upward-moving speed of the mechanism 60 is reduced before stopping at the upper limit position. The lower limit proximity sensor 113 detects a lower limit position for the mechanism 60 during a downward movement of the mechanism 60. An upper sensor plate 114 is mounted on a sensor block sliding plate 115 which is secured on an inner face of either one of the right and left clamp bar side plates 2 (see FIG. 4). The upper sensor plate 114 slidably moves on the sensor block sliding plate 115 in the vertical direction so as to adjust the upper limit position and the medium position of the upward movement of the pressing- and applying-mechanism 60. Further, a lower sensor plate 116 is movably mounted on the sensor rail 100 in the longitudinal direction of the sensor rail 100 so as to adjust the lower limit position of the downward movement of the mechanism 60.

The stroke for pressing of the emulsion film F onto the mesh screen has a narrower range in the vertical direction as compared with the stroke for the application of the emulsion E. For this reason, the upper sensor plate 104 and the lower sensor plate 105 used for the stroke for pressing of the emulsion film F are respectively positioned between the upper sensor plate 114 and the lower sensor plate 116 used for the stroke for the application of the emulsion E.

Operation

One example for use of an apparatus according to the present invention will be described hereinafter together with each operation of the printing plate supporting means 10, the film feed means 20, the film guiding- and cutting-mechanism 30 and the pressing- and applying-mechanism 60.

First, the screen printing plate S is disposed in an upright state and supported by the printing plate supporting means 10 fixedly mounted in the supporting frame 1.

When the emulsion film F is attached onto the screen printing plate S, the roller unit 80 having the pressing roller 87 is mounted on the front bucket pipe 73 of the pressing/applying selecting means 65 of the pressing- and applying-mechanism 60 while the emulsion film F of a rolled form is installed on the film feed means 20 disposed at the upper portion of the supporting frame 1 (see FIGS. 2 and 6).

In the film guiding- and cutting-mechanism 30 facing the upper portion of the screen printing plate S, the vertically actuating system permits the film cutting- and supporting means 45 to move in the vertical direction and stop at level corresponding to a given cutting position of the emulsion film F to be attached onto the screen printing plate S. The actuation of the horizontally actuating system causes the cutter-guide-on plate 55 of the film cutting- and supporting-means 45 to abut against the screen printing plate S. Then, the upper clamp rail 48 and the lower clamp rail 53 are allowed to retreat from the cutter guide plate 56 and the cutter guide-on plate 55 by actuating the upper and lower clamp cylinders 47 and 52. To this end, the emulsion film F is passed through a clearance formed between the upper and lower clamp rails 48, 53 and the cutter guide-on and guide plates 55, 56 (see FIG. 5). The pressing- and applying-mechanism 60 positioned at the lower portion of the screen printing plate S permits the pressing roller 87 and the emulsion bucket 97 thereof, which are respectively disposed on front (printing) and rear sides of the screen printing plate S in opposed relation to each other with respect to the screen printing plate S, to retreat from the screen printing plate S. Further, a given amount of the emulsion E is reserved in the emulsion bucket 97 of the mechanism 60 (see FIG. 6).

The emulsion film F is inserted into the clearance of the film cutting- and supporting-means 45 while the emulsion layer side thereof abuts against the printing side of the screen printing plate S, and led to the pressing- and applying-mechanism 60 standing by at the lower portion of the screen printing plate S. When air pressure is applied to the horizontally actuating cylinder 69 of the pressing/applying selecting means 65, the pressing roller 87 is permitted to advance toward the printing side of the screen printing plate S and press and attach the end of the unrolled emulsion film F onto the printing side. On the other hand, when air pressure is applied to the upper and lower clamp cylinders 47, 52 of the film cutting- and supporting means 45 positioned at level corresponding to the predetermined cutting position of the emulsion film F, the clamp rails 48, 53 are permitted to advance toward the printing side of the screen printing plate S. To this end, the emulsion film F is sandwiched between the upper and lower clamp rails 48, 53 and the cutter guide and guide-on plates 56, 55. Then, the cutter 58 is moved along the upper clamp rail 48 while keeping in contact with a lower edge of the cutter guide plate 56, so that the emulsion film F is cut into the given length (see FIGS. 4 and 5).

After such a cutting operation of the film cutting and supporting-means 45, air pressure is applied to the horizontally actuating cylinder 69 of the emulsion applying means 95. The emulsion bucket 97 is permitted to advance toward and contact the rear side of the screen printing plate S so that the emulsion film F is sandwiched between the emulsion bucket 97 and the pressing roller 87 positioned on the printing side of the screen printing plate S (see FIG. 6). Further, air pressure is applied to the inclining cylinder 75 of the emulsion applying means 95, so that the bucket pipe arm 72 and the rear bucket pipe 96 which are positioned on front and rear sides of the emulsion bucket 97 and support the emulsion bucket 97, are caused to pivotably rotate. To this end, the emulsion bucket 97 is inclined with respect to the mesh screen of the screen printing plate S and the emulsion E in the emulsion bucket 97 flows out of the emulsion bucket 97. In such a condition, when the right and left carriage bases 61 are moved upward, the pressing roller 87 presses the emulsion film F onto a printing side of the mesh screen and the inclined emulsion bucket 97 supplies the emulsion E through the mesh screen onto the emulsion layer of the emulsion film F. The emulsion layer is wetted by the supplied emulsion E so that the emulsion film F is attached onto the mesh screen.

When the pressing- and applying-mechanism 60 moves upward and approaches a level of the film guiding- and cutting-mechanism 30, the medium proximity sensor 102 detects the upper sensor plate 104. Air pressure applied to the lower clamp cylinder 52 is reduced to release the emulsion film F while air pressure applied to the upper clamp cylinder 47 is maintained. At the same time, a speed of upward movement of the pressing- and applying-mechanism 60 is decreased.

Further, when the upper proximity sensor 101 detects the upper sensor plate 104, the film cutting- and supporting means 45 moves upward and retreats from the pressing- and applying-mechanism 60. An end of the emulsion film F which is released from a pressing force of the lower clamp cylinder 52, is adhered onto the screen printing plate S by the emulsion E. The film cutting- and supporting means 45 moves upward to a standby position for a subsequent operation thereof, while an end portion of the emulsion film F drawn from the film feed means 20 is held by continuous actuation of the upper clamp cylinder 47 onto the cutter guide plate 56.

Thus, the emulsion layer of the emulsion film F is completely attached onto the mesh screen and the upward movement of the pressing- and applying-mechanism 60 is terminated.

After the upward movement of the pressing- and applying-mechanism 60 stops, backward air pressure is applied to the inclining cylinder 75 and the horizontally actuating cylinder 69 of the emulsion applying means 95 of the pressing- and applying-mechanism 60, so that the emulsion bucket 97 retreats from the mesh screen and returns to the horizontal rest position. In the same manner as in the emulsion applying means 95, backward air pressure is applied to the horizontally actuating cylinder 69 of the pressing- and applying-selecting means 65 of the pressing- and applying-mechanism 60, so that the pressing roller 87 retreats from the mesh screen. Thereafter, the pressing- and applying-mechanism 60 moves downward and stops at a standby position thereof to wait for a subsequent operation thereof.

Thus, when the attachment of the emulsion layer of the emulsion film F onto the mesh screen by the emulsion E is completed, the substrate of the emulsion film F is released from the emulsion layer.

Subsequently, the next operation of setting and attaching the emulsion film F onto the mesh screen of the screen printing plate S is started. A new screen printing plate S is placed on the printing plate supporting means 10. The film cutting- and supporting means 45 of the film guiding- and cutting-mechanism 30 moves downward to the film-cutting position while the end portion of the emulsion film F is sandwiched between the upper clamp rail 48 and the cutter guide plate 56 by a pressing force of the upper clamp cylinder 47. At the film-cutting position of the film cutting- and supporting means 45, the respective pressing forces of the upper and lower clamp cylinders 47, 52 exerted on the emulsion film F are reduced to generate a clearance between the upper clamp cylinder 47 and the cutter guide plate 56 and between the lower clamp cylinder 52 and the cutter guide-on plate 55. The end portion of the emulsion film F is inserted into the clearance and passed therethrough down to the standby position of the pressing- and applying-mechanism 60.

An automatic control may be used to perform such operations as described hereinbefore, whereby the sequence and number of operations including the cutting of the emulsion film F after pressing and applying of the film by the pressing- and applying-mechanism 60, a downward return of the film cutting- and supporting means 45 following the completion of the applying operation by the pressing- and applying-mechanism 60 and return thereof to the standby position, and other conditions for operations of the pressing- and applying-mechanism 60, are desirably and optionally settable.

On the other hand, when the emulsion E is directly applied onto the mesh screen, the emulsion bucket 92 is mounted on the front bucket pipe 73 which is disposed in the pressing/applying selecting means 65 of the pressing- and applying-mechanism 60 (see FIG. 7).

When air pressure is applied to the horizontally actuating cylinders 69 of the pressing- and applying-mechanism 60 disposed at the front and rear sides of the mesh screen, the emulsion buckets 92, 97 are permitted to advance toward the mesh screen and interpose the mesh screen therebetween. Further, when air pressure is applied to the inclining cylinders 75 disposed at the front and rear sides of the mesh screen, the emulsion buckets 92, 97 are inclined with respect to the mesh screen so that the emulsion E therein flows out of the emulsion buckets 92, 97. In this case, when the emulsion buckets move upward while being kept pressed onto the mesh screen in non-inclined state, the emulsion buckets squeeze the applied emulsion E from the mesh screen. Inversely, when the emulsion buckets move upward while being kept pressed onto the mesh screen in inclined state, the emulsion E flows from the emulsion buckets and is applied onto the mesh screen.

When the pressing- and applying-mechanism 60 moves upward, the emulsion E is applied onto both sides of the mesh screen by the inclined emulsion buckets 92, 97 or onto one side of the mesh screen by inclining either one of the emulsion buckets 92, 97.

Further, when the medium proximity sensor 112 of the pressing- and applying-mechanism 60 approaches the upper sensor plate 114, the emulsion buckets 92, 97 are permitted to return to a non-inclined rest position while a speed of the upward-movement of the pressing- and applying-mechanism 60 is decreased. Thus, emulsion-applying operation of the emulsion buckets 92, 97 is completed. When the upper limit proximity sensor 111 detects the upper sensor plate 114, the upward movement of the pressing- and applying-mechanism 60 stops.

Following the stop of the pressing- and applying-mechanism 60, back air pressure is applied to the inclining cylinders 75 and the horizontally actuating cylinders 69 so that the emulsion buckets 92, 97 are permitted to retreat horizontally from the mesh screen. The pressing- and applying-mechanism 60 returns to the standby position to wait for a subsequent operation thereof.

Such an applying and squeezing operation of the pressing- and applying-mechanism 60 may be also performed by an automatic control, whereby the sequence and number of operations including application and squeeze of the emulsion E by means of the emulsion buckets 92, 97 disposed at the front and rear sides of the mesh screen of the screen printing plate S, selection of the printing side or a squeezing side of the mesh screen, and the like are desirably and optionally settable.

In accordance with the invention, the emulsion film F or the emulsion E is selectively applied onto the mesh screen of the screen printing plate S without the necessity of provision of a plurality of individual single-purpose apparatus having the separate features. Therefore an area for installation of the apparatus and facility costs are reduced.

Namely, a dual-purpose apparatus according to the invention includes the pressing- and applying-mechanism 60 which is provided at the front side of the mesh screen of the screen printing plate S with the pressing-/applying selecting means 65 replaceably fitted with the roller unit 80 or the bucket unit 90, and at the rear side thereof with the emulsion applying means 95 including the emulsion bucket 97. Further, the roller unit 80 or the bucket unit 90 is replaceably and detachably mounted on the front bucket pipe 73 of the pressing/applying selecting means 65 which is disposed at the front (printing) side of the mesh screen of the screen printing plate S. The mounting and detaching operation of the roller unit 80 and the bucket unit 90 is conveniently performed at a front side of the apparatus without a lot of labor, resulting in considerable improvement in operating efficiency.

Actuating systems for the bucket pipes 73, 96 of the pressing/applying selecting means 65 and the emulsion applying means 95, by which the respective bucket pipes horizontally advance toward and retreat from the mesh screen of the screen printing plate S and incline downward, are almost symmetrically constituted relative to the screen printing plate S. To this end, it is realized to simplify a control of these means and a control system thereof. Further, when the emulsion E is directly applied onto the mesh screen by using the bucket unit 90 mounted on the pressing/applying selecting means 65, the emulsion buckets 92, 97 are usable for both applying and squeezing operation, resulting in manufacture of a wide variety of screen printing plates.

Further, when the emulsion film F is interposed between the pressing roller 87 of the roller unit 80 and the emulsion bucket 97 of the emulsion applying means 95, the pressing roller 87 is adjustable at level in the vertical direction so that the roller 87 is opposite to a front edge of the emulsion bucket 97.

Specially, the film guiding- and cutting-mechanism 30 acts for guiding the emulsion film F to a film-cutting position along the mesh screen of the screen printing plate S, cutting the film F into a given length in the film-cutting position, and independently and detachably supporting each of opposite end portions of the film F on a film feed means side and a pressing- and applying-mechanism side. Therefore, the film F is smoothly attached to the mesh screen and is readily cut into the given length, resulting in facilitating a next film-setting operation.

When the pressing- and applying-mechanism 60 moves upward from the lower position of the screen printing plate S, the pressing/applying selecting means 65 replaceably fitted with the roller unit 80 or the bucket unit 90 is advantageously operated as follows. Namely, in case that the roller unit 80 is mounted, the emulsion E flows out of the emulsion bucket 97 of the emulsion applying means 95 and is applied onto the rear side of the mesh screen of the screen printing plate S while the pressing roller 87 of the roller unit 80 presses the emulsion film F onto the mesh screen. Accordingly, a layer thickness of the emulsion film F is adjustable by controlling a pressing force and the number of emulsion-applying operation so as to correctly form a desired thickness of the layers.

On the other hand, when the bucket unit 90 is mounted, the emulsion bucket 92 of the bucket unit 90 and the emulsion bucket 97 of the emulsion applying means 95 can be separately inclined on the front and rear sides of the mesh screen. Therefore, the emulsion E is applied onto both sides of the mesh screen or is applied onto one side thereof and squeezed from the other side thereof. Accordingly, various combinations of applying and squeezing operation are realized according to many kinds of need.

What is claimed is:

1. A dual-purpose apparatus for selectively applying an emulsion and an emulsion layer-containing film on a mesh screen of a screen printing plate, comprising a printing plate supporting means for supporting the screen printing plate, a film feed means for feeding the emulsion layer-containing film, a film guiding-and-cutting mechanism for guiding the emulsion layer-containing film along the mesh screen of the screen printing plate, and a pressing-and-applying-mechanism for pressing the emulsion layer-containing film and for applying the emulsion onto the mesh screen;

said pressing-and-applying mechanism comprising means to vertically move said pressing-and-applying mechanism, and a pressing/applying selecting means and an emulsion applying means which are respectively disposed at front and rear sides of the screen printing plate;

said pressing/applying selecting means being replaceably equipped with a roller unit for pressing the emulsion layer-containing film abutting against the mesh screen of the screen printing plate to apply the emulsion layer-containing film thereonto, and with a bucket unit for supplying the emulsion onto the mesh screen, said emulsion applying means being equipped with an emulsion bucket for applying the emulsion onto the mesh screen;

vertically movable carriage bases for supporting said pressing/applying selecting means and said emulsion applying means;

said pressing/applying selecting means further comprising a first bucket pipe for replaceably mounting thereon the roller unit and the bucket unit;

said emulsion applying means further including a second bucket pipe for mounting thereon the emulsion bucket, said first and second bucket pipes being supported between said vertically movable carriage bases, and separate actuating systems being provided for actuating said first and second pipes, respectively, which are substantially symmetrically arranged at front and rear sides of the screen printing plate, in such a manner that the bucket pipes are independently caused to horizontally move toward and away from the screen printing plate and incline relative thereto;

said film guiding-and-cutting mechanism including film cutting-and-supporting means, moving means for moving said film cutting-and-supporting means upwards and downwards in a vertical direction so as to vertically move said film cutting-and-supporting means relative to the emulsion layer containing film, and film-cutting position detecting means including a proximity sensor mounted on said film-cutting-and-supporting means and a sensor block adjustable in a vertical direction so that when said proximity sensor detects said sensor block said moving means is caused to stop to position said film-cutting-and-supporting means at a predetermined position at which said film is to be cut, said film cutting-and-supporting means including two clamp cylinders and a cutter guide plate positioned at a front side and a rear side of the emulsion layer-containing film, respectively, said clamp cylinders being operated to advance towards and retreat from said cutter guide plate so as to permit the emulsion layer-containing film to be sandwiched between said clamp cylinders and said cutter guide plate to enable cutting of said film drawn from said feed means into given length and hold said film in contact with the mesh screen; and means providing that when said pressing-and-applying mechanism is moved upwards and approaches a level of said film guiding-and-cutting mechanism, said emulsion layer-containing film held at a printing side of the screen printing plate is released so that said film-guiding-and-cutting mechanism may be moved upward to a standby position to facilitate setting of said film for a next step of operation while an end portion of said film is held by one of said clamp cylinders onto said guide plate, wherein said roller unit comprises a roller unit base mounted on said first bucket pipe by mounting means including clamps, right and left roller guide blocks adjustable in their vertical position, and a pressing roller rotatably supported between said right and left roller guide blocks.

* * * * *